July 13, 1965 R. G. KENWRIGHT ETAL 3,195,080

RADIO AND TELEVISION TUNERS

Filed Nov. 2, 1962 2 Sheets-Sheet 2

United States Patent Office 3,195,080

Patented July 13, 1965

3,195,080

RADIO AND TELEVISION TUNERS

Richard G. Keawright, Warsash, Rexham A. Mann, Southampton, and Robert Knox, Park Gate, near Southampton, England, assignors to The Plessey Company Limited, Ilford, England, a British company Filed Nov. 2, 1962, Ser. No. 235,158

2 Claims. (Cl. 334—7)

Figure 1:
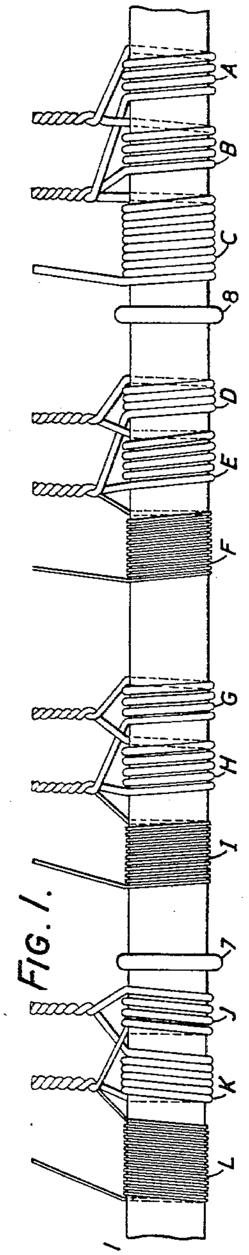

This invention relates to radio, television and like tuners. In particular the invention is concerned with a tuner for permitting selective tuning of a receiver for any one of the channels provided in the so-called bands I and III which have been allocated, for the purposes of television, in the United Kingdom. The application of the device is not restricted to tuning of channels in bands I and III. It will be appreciated, as will be understood from the following description, that the invention can be applied to the tuning of channels in bands other than bands I and III.

The so-called bands I and III have been divided into thirteen separate channels which are identified as channels one to thirteen. Channels one to five have been allocated to band I and channels six to thirteen have been allocated to band III. In order to be able correctly to tune a television receiver to any selected one of the channels it is necessary to be able simultaneously to tune the aerial coil, the band pass coil and the oscillator coils associated with the particular channel to which it is desired to tune the receiver. It will also be understood that in order for a tuning arrangement to be suitable for such purposes it must be possible to reset the tuning mechanism from one channel to another as desired.

It is an object of the present invention to provide a tuner which includes mechanical arrangements whereby it is possible to effect tuning with a high standard of resetability and repeatability. A further object of the invention is to provide such a tuner in which a high degree of reset accuracy is preserved together with provision for tuning each button throughout its band and also giving provision for fine tuning.

In accordance with a first aspect of the present invention there is provided a tuner for a radio receiver in which all of the windings or coils associated with the tuning of the receiver are arranged in sets, there being one set for each frequency band to be tuned, so mounted on a common former as to be tunable by a single tuning element.

In accordance with a second aspect of the invention a push button tuning mechanism is arranged to tune a radio, television or like receiver by positionally moving a single tuning element, said tuning element being operated by hinged plate, the hinge axis of which is arranged to be parallel to a row of push buttons, the plate being operated by means of elements in screw threaded engagement with shafts of said push buttons so as to occasion a movement of the plate determined in the case of each push button by the setting of said element with respect to the shaft and a stop against which the button is permitted to return. Conveniently this stop is constituted by the latch bar of the push button mechanism.

In accordance with a further aspect of the invention a tuning arrangement for a radio receiver such as a television receiver, includes at least one coil within which a tuning slug or element is movable to cause a change of inductance, said coil being constituted by two or more windings which are connected in parallel. Conveniently the separate windings forming the coil are contiguously wound. The term 'contiguously wound' is used in the sense of a winding in which the insulation or covering of adjacent turns is touching or very nearly so.

Figure 3:
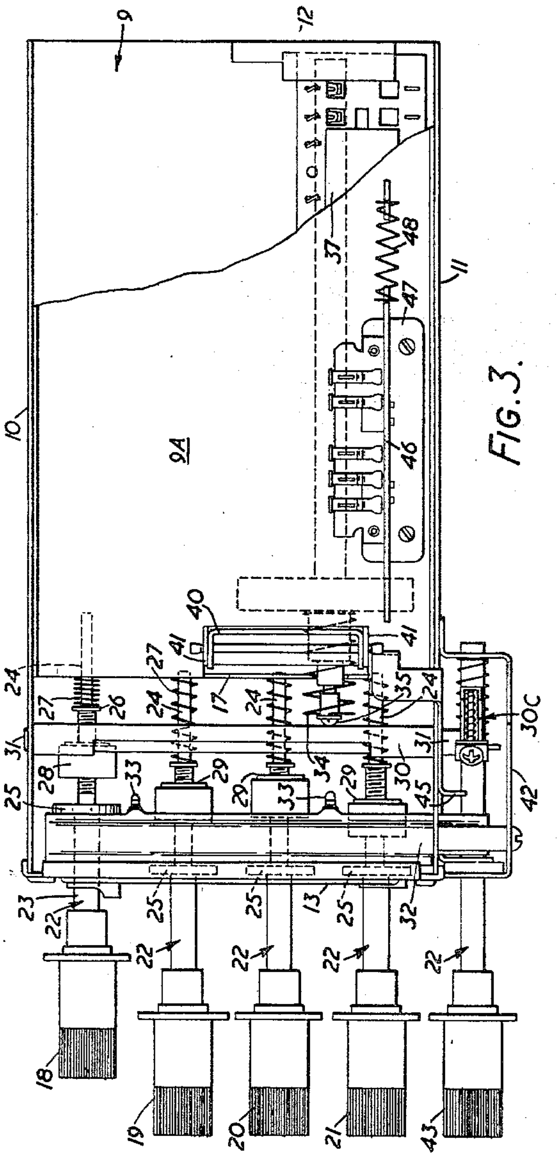
Figures 2, 4, 5:
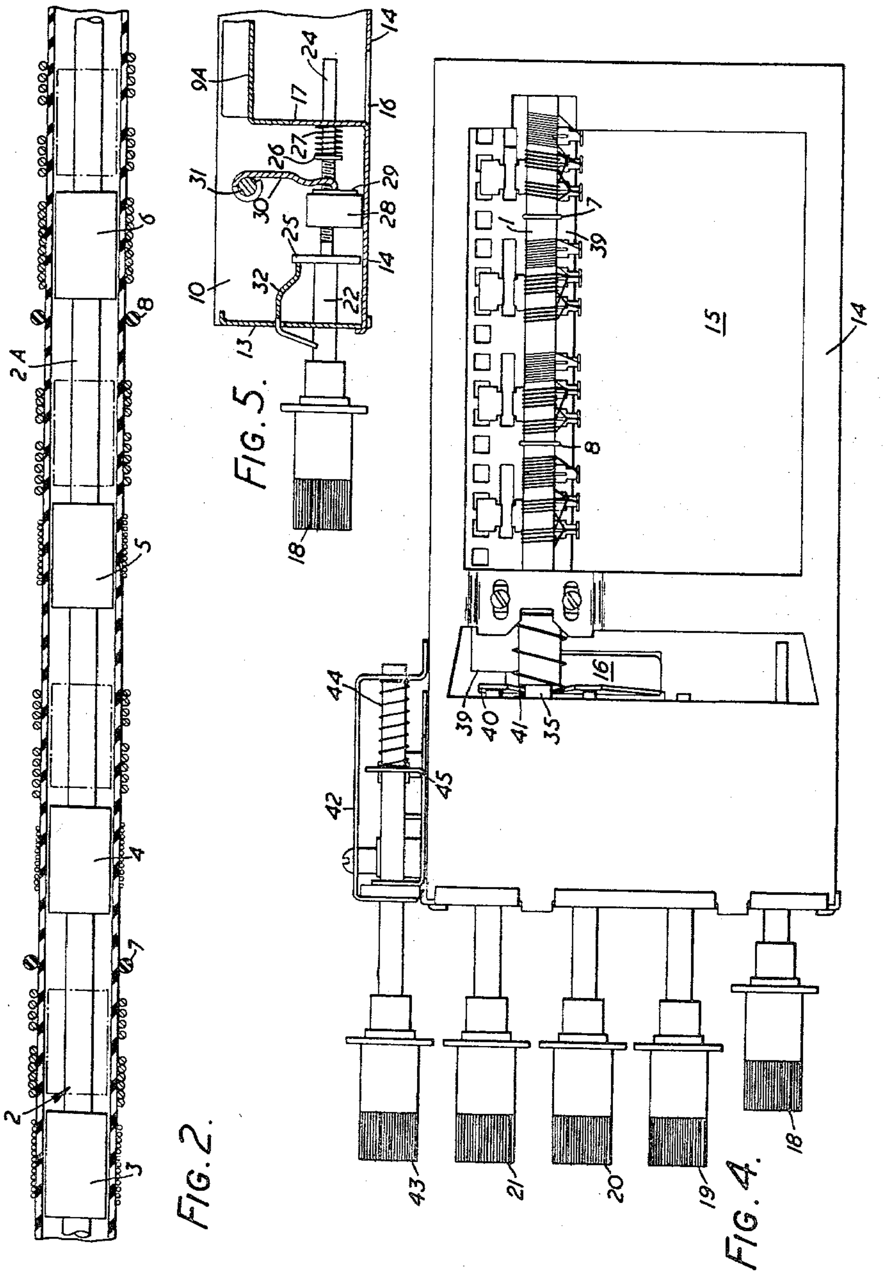

For a better understanding of the invention and to show how the same may be carried into effect reference will now be made to the accompanying drawings in which FIGURE 1 shows the aerial, band pass and oscillator coils associated with bands I and III wound on a common former, FIGURE 2 is a section of the former and coils shown in FIGURE 1, FIGURE 3 schematically illustrates the combination of the coils and former shown in FIGURES 1 and 2 with a push button tuning mechanism the drawing illustrating a plan view which is part cut away, FIGURE 4 is a view of the underside of the tuning device shown in FIGURE 3, and FIGURE 5 is a sectional view of a detail of the tuning device of FIGURES 3 and 4.

All of the coils associated with the tuning of a television receiver namely the aerial, the two-band pass coils and the oscillator coil are provided upon a common tubular former comprising a suitable insulating material. In the FIGURE 1 the coil windings on the former have been identified by the letters A, B, C, D, E, F, G, H, I, J, K, and L. The windings are so spaced along the former I as to form four sets of three, the sets comprising windings ABC, DEF, GHI and JKL respectively. The windings C, F, I, and L are those associated with band I and the remaining windings formed by the pairs AB, DE, GH, and JK are associated with the band III. The windings associated with band I are alternately spaced along the former with the windings associated with band III. The oscillator winding for band III is adjacent to the oscillator winding for band I, the band pass windings for band I are adjacent to the band pass windings for band III, and the aerial winding for band I is adjacent to the aerial winding for band III.

A tuning element 2 comprising a glass rod 2*a* carrying four spaced apart slugs, 3, 4, 5 and 6 the latter being formed from aluminium or other suitable material is slidably located within the former I. The aluminium slugs 3, 4, 5 and 6 are so spaced along the glass rod 2*a* that they are able simultaneously to tune the windings of any one set on the former. In other words when the tuning element is in the position shown in FIGURE 2 the aluminium slugs 3, 4, 5 and 6 are in tunable co-operation with the windings L, I, F and C, i.e. the windings associated with band I, and when the tuning element moved axially of the tube into its second tuning position (shown in dotted lines) the slugs 3, 4, 5 and 6 are in tuning relationship with the windings K.J., H.G., E.D. and B.A.

The windings, spacings and number of turns of the windings A to L are so chosen that when the tuning element 2 is in tuning relationship with the windings they are able to effect all of the necessary tuning conditions for the tuning of the selected channels.

Table I sets out the dimensions of the wire in Standard Wire Gauge (S.W.G.), the number of turns and the direction, i.e. clockwise (C.W.) or anti-clockwise (A.C.W.), on the former which the windings are wound of the tuner arrangement of FIGURE 1 for band I and band III television reception.

The positions of the windings along the former I are such that as each slug 3, 4, 5 or 6 enters or leaves the windings of one band they commence to leave or enter the windings associated with the other band. The turns of the various widings are so positioned relative to each other that the insulation or covering of adjacent turns thereof is touching or is very nearly touching. By this means a change of inductance with the slug movement can be made more linear and at the same time mechanical winding methods can be used to bond the turns together. The covering may be fusable and the locking action obtained by the application of heat. Alternately all of the turns of the coil may be positionally locked by an adhesive such as acetone or nylon acetate to the former I. In either method it is intended that the turns cannot become displaced in use.

As will be seen from the drawing the winding pairs KJ, HG, ED, and BA are connected in parallel with each other which achieves a more linear change of inductance with slug movement.

In addition to the aforementioned windings A to L there are two further windings 7 and 8 provided on the former I, the windings 7 and 8 being short circuited turns which are positionally adjustable relative to the former I.

In order to be able selectively to tune for any particular channel within a tuning band it is only necessary to displace the tuning element 2 axially of the former. This movement of the tuning element is effected as is illustrated in FIGURES 3, 4 and 5 of the drawings by push button mechanism.

The push button tuner includes a chassis 9 which is in the form of an open metallic tray having side walls 10, 11; an end wall 12; a face plate 13 and a base 14. A rectangular portion of the base 14 is cut away to provide a rectangular cut-out 15.

A shaped cut-out 16 is also formed in the base, the metal removed to form this cut-out being conveniently deformed upward to provide a vertical wall 17 extending parallel to the face plate 13. A series of push buttons 18, 19, 20 and 21 are slidably mounted in the face plate 13 and the wall 17. Each push button includes a shaft 22 which is stepped mid-way along its length to provide a larger diameter portion 23 which is slidable in the face plate 13 and a smaller diameter portion 24 which is slidably mounted in the wall 17. A circular stop 25 is secured to the shaft. The portion 24 is threaded from point near the step for approximately half its length, the actual length of the threaded portion being selected so that it cannot, whatever the position of the shaft 23 with respect to the face plate 13 and wall 17, engage with the wall 17. A smaller diameter stop plate 26 is secured to the shaft portion 24, the plate 26 serving as a locating abutment for one end of the compression spring 27 whose other end bears against the wall 17. Each spring 27 acts as a return spring which resiliently loads the push button towards its rest position (the position assumed by the buttons 19 to 21 in FIGURE 3).

A running nut 28 is provided on each threaded portion. Each one of the nuts is positionally adjustable along the shaft by rotation of the push button shaft 22. The nuts 28 are conveniently made of a material, such as nylon, which tends to grip the shaft thereby restricting the ease of movement of the nut which avoids backlash. The nuts can thus be regarded as captive nuts. Each nut is provided with a metallic face plate 29 which is intended to push against a hinged plate 30 which is pivotally carried on a spindle 31 mounted in the side walls 10 and 11 of the tray 9. The hinge axis of the plate is perpendicular to the axis of the push buttons and is parallel to the face plate 13 and the wall 17. The spindle 31 has a headed end which abuts against the wall 10 and a further end which is locked in place by a clamping device **30*b***.

The stop 25 is intended to co-operate with a latch plate 32 which is pivotally mounted on the face plate 13, the plate 32 being so spring-loaded that the free edge thereof always tends to move downwards towards the push button shafts 22. Conveniently the plate 32 is provided with two lugs 33 each of which serves as anchorage for one end of a tension spring (not shown) whose other end is anchored to the base 14 of the tray 9. The previously described former 1 is mounted in the tray so that the axis of the movable tuning element 2 is parallel to the axes of the push buttons. The tuning element 2 is resiliently loaded by a spring 34 so that the end 35 thereof presses against the spring plate 30. That is to say the loading of the element 2 is such as to move it into the full line position shown in FIGURE 2. Preferably the spring 34 serves the dual purposes of resiliently loading the plate 30 towards the nuts 28 and also moving the element 2 into the position shown in full lines in FIGURE 2.

The tuning arrangement as so far described operates as follows. The push buttons 18, 19, 20 and 21 have as their rest positions the positions assumed by the buttons 19 to 21 of FIGURES 3 and 4. The depressed position of the buttons is the position assumed by the button 18 in FIGURES 3 and 4. In the rest position of a button its stop plate 25 is adjacent to the rear surface of the face plate 13 whilst its nut 28 is not in contact with the plate 30. In the depressed position the rear face of its stop plate 25 engages the edge of the latch plate 32 and its nut 28 abuts against the plate 30, the latter having been turned about its axis by an amount which is related to the position of the nut 28 upon the shaft of the push button. If it is required to change the selected one of the tunable bands the associated push button is depressed. For example the push button 19 will be considered. On depressing the button 19 the stop 25 initially starts to push against the underside of the latch plate 32 pivoting same. Since the latch plate is profiled as shown in FIGURE 5 the plate is automatically moved out of engagement with any stop 25 with which it may be engaged before the stop 25 of the push button being depressed (button 19) has been moved clear of the plate 32. In other words immediately prior to the latching of the plate 32 with the stop 25 of the push button 19, the stop 25 of the push button 18 is released, whereupon the loading of the spring 27 will return the button 18 to its rest position. As soon as the button 18 is thus moved the spring 34 will cause the movable tuning element end 35 to push the spring plate 30 in such direction as to follow the movement of the push button 18. When the stop 25 of the button 18 moves clear of the latch plate 32 the latter will be pivoted by resilient loading thereof into its latching position behind the stop 25 of the push button 19. This is shown in FIGURE 5. At the same time the face plate 29 on the captive nut 28 will abut the swinging plate 30 and return the plate 30 through an angle which depends upon the position of the nut 28 along the shaft portion 24 of the push button 19. Since the swinging plate 30 bears against the end 35 of the tuning element 2 the element 2 is moved relative to the former I by an amount which is related to the amount of swing of the plate and thus as has been previously indicated, the position of the nut 28 upon the shaft of the push button 19.

The resilient loading of the push button 19 by its spring 27 pushes the stop plate 25 firmly against the edge of the latch plate 32. The plate 32 thus forms a stop against which the depressed push button is permitted to return. Similarly the resilient loading of the tunable element, and in consequence the swinging plate 30, pushes the latter firmly against the plate 29 on the nut 28.

The movability of the nut 28 on the push button shaft gives the important facility of enabling an operator to select a station in the relevant band and to carry out fine tuning operations on that station merely by rotation of the knob of the push button to produce a relative movement between the nut 28 and the shaft portion 24. It will be apparent that each knob is readily turnable to any desired channel. The windings on the former I are connected to the actual electronic tuning circuitry (not shown) the latter being mounted on a base 9A which is secured to the chassis 9. The windings are connected to the circuitry via a slide type switch 37 comprising a slidable element 39 resiliently loaded by a spring (not shown) towards the face plate 13. The front end of the slide abuts one side of a second swing plate 40 pivotally mounted in brackets 41 upstanding from the base 9A attached to the tray. The plate 40 is so positioned with respect to the wall 17 that the inner ends of the portions 24 of the push buttons 20 and 21 can push there against whereupon actuation of these push buttons will simultaneously move the plate to operate the switch. The plate 40 has at its bottom face thereof a U-shaped cut-out 41 which is able to accommodate with clearance the end 35 of the movable tuning element 2. By reason of the resilient loading of the switch element 39 the latter automatically tends to return to its rest position (shown in the drawing) when the buttons 20 and 21 are in their undepressed rest positions. The purpose of the switch 37 is to enable the tuner to be automatically switched from tuning to band I to band III frequencies. It, therefore, follows that the push buttons 18 and 19 are associated with the selection of any two selected channels within a first band and push buttons 20 and 21 are concerned with the selection of any two selected channels in the other band.

The tuning mechanism also incorporates a further switching system and push button by means of which frequency modulation signals for sound reception can be switched on or off. This further means comprises a bracket 42 secured to the tray side wall 11. A further push button 43 is slidably supported by the bracket, the push button being resiliently loaded towards the rest position (that shown in FIGURES 3 and 4) by a spring 44. The push button 43 carries a switch actuating arm 45 which is shaped so as to connect with a spring loaded movable slide 46 of a slide-type switch 47 is secured to the tray. The movable slide 46 is resiliently loaded by a spring 48 towards a rest position that shown in FIGURE 3.

*Table I*

| Winding | A | B | C | D | E | F | G | H | I | J | K | L |
|---|---|---|---|---|---|---|---|---|---|---|---|---|
| Direction of winding | C.W. | C.W. | C.W. | C.W. | C.W. | C.W. | C.W. | C.W. | C.W. | A.C.W. | A.C.W. | A.C.W. |
| Wire (S.W.G.) | 24 | 24 | 28 | 24 | 24 | 36 | 24 | 24 | 36 | 26 | 26 | 36 |
| Number of turns as fitted to tuner | 4 | 4 | 11 | 4 | 5 | 15 | 4 | 5 | 16 | 4 | 6 | 17 |

What we claim is:

1. An inductive tuner device, capable of being tuned to a plurality of frequency channels in each of at least two frequency bands comprising a hollow longitudinally extending common former, said former carrying sets of tuning coils, each set including at least one tuning coil for each of the frequency bands, the tuning coils for different bands being adjacent to one another and being correspondingly positioned in the same order in each set, and a longitudinally extending common tuning member, said member being slidably mounted within the common former and carrying a plurality of spaced apart tuning elements, one of which elements being associated with each set of tuning coils, whereby in a first position of the tuning member the tuning elements are tunably associated with tuning coils of one frequency band and in a second position of the tuning member the tuning elements are tunably associated with the tuning coils of another of the frequency bands, and wherein at least one tuning coil in each of said sets of tuning coils is constituted by at least two windings connected in parallel and spaced apart longitudinally in adjacent relationship along the common former.

2. An inductive tuner device capable of being tuned to a plurality of frequency channels in each of at least two frequency bands comprising a hollow longitudinal extending common former, said former carrying sets of tuning coils, each set including at least one tuning coil for each of the frequency bands, the tuning coils for different bands being adjacent to one another and being correspondingly positioned in the same order in each set, and a longitudinally extending common tuning member, said member being slidably mounted within the common former and carrying a plurality of spaced apart tuning elements, one of which elements being associated with each set of tuning coils, whereby in a first position of the tuning member the tuning elements are tunably associated with the tuning coils of one frequency band and in a second position of the tuning member the tuning elements are tunably associated with the tuning coils of another of the frequency bands, a hinged plate which is pivotable to move the common tuning member to effect a tuning operation, a row of push buttons, a shift to each button, the longitudinal axes of the shafts being perpendicular to the longitudinal axis of the hinge, an abutment element in screw threaded engagement with each shaft, the abutment elements being co-operable to occasion a movement of the plate determined in the case of each push button by the setting thereof with respect to its associated shaft, a stop against which each push button is caused to return, and a longitudinally extending slide switch, the switch being arranged to extend substantially parallel with the common former, comprising two members carrying co-operable contacts, one member being fixed and the other member being slidable relative to the common former, the contacts of one member being connected to the tuning coils, the contacts of the other member being connectible to circuits in which the coils are to be selectively connected, and the slidable member being arranged to be actuated whenever selected ones of the push buttons are operated, fine tuning of any selected push button tuning position being effected by rotation of the push button shaft relative to the abutment element after the latter has engaged with the hinged plate, wherein the slidable member of the switch is resiliently loaded towards a first position, and including a second hinged plate arranged to move the slidable member to a second position to effect a switching movement, the shafts of the selected ones of the push buttons being arranged to push against the second hinged plate when any one of them is operated to effect a switching operation whilst any fine tuning being effected on the selected ones of the push button having no effect on the slidable switch member.

References Cited by the Examiner

UNITED STATES PATENTS

| | | | |
|---|---|---|---|
| 2,242,287 | 5/41 | Cohen et al. | 74—10.29 |
| 2,501,003 | 3/50 | Pifer | 334—7 X |
| 2,521,968 | 9/50 | De Tar | 333—77 |
| 2,651,397 | 9/53 | Miller | 334—7 |
| 2,687,514 | 8/54 | Roberts | 325—462 |
| 2,729,746 | 1/56 | Pan | 334—77 |
| 2,821,624 | 1/58 | Koch | 334—77 X |
| 2,867,765 | 1/59 | Klettke et al. | 334—77 X |
| 2,930,241 | 3/60 | Roback | 74—10.33 |
| 2,956,161 | 10/60 | Cady | 334—29 |

FOREIGN PATENTS

| | | |
|---|---|---|
| 382,076 | 10/32 | Great Britain. |
| 280,990 | 2/52 | Switzerland. |

OTHER REFERENCES

Radiotron Designer's Handbook, page 466 relied on, 1953 edition.

HERMAN KARL SAALBACH, *Primary Examiner.*